(12) United States Patent
Shibuya et al.

(10) Patent No.: US 10,636,685 B2
(45) Date of Patent: Apr. 28, 2020

(54) NOZZLE AND WORK POLISHING APPARATUS

(71) Applicant: Fujikoshi Machinery Corp., Nagano (JP)

(72) Inventors: Kazutaka Shibuya, Nagano (JP); Yoshio Nakamura, Nagano (JP)

(73) Assignee: FUJIKOSHI MACHINERY CORP., Nagano (JP)

( * ) Notice: Subject to any disclaimer, the term of this patent is extended or adjusted under 35 U.S.C. 154(b) by 362 days.

(21) Appl. No.: 15/470,441

(22) Filed: Mar. 27, 2017

(65) Prior Publication Data

US 2017/0301573 A1 Oct. 19, 2017

(30) Foreign Application Priority Data

Apr. 19, 2016 (JP) .................................. 2016-083322

(51) Int. Cl.
*H01L 21/67* (2006.01)
*B24B 57/02* (2006.01)
(Continued)

(52) U.S. Cl.
CPC ........ *H01L 21/67219* (2013.01); *B24B 37/04* (2013.01); *B24B 57/02* (2013.01);
(Continued)

(58) Field of Classification Search
None
See application file for complete search history.

(56) References Cited

U.S. PATENT DOCUMENTS

| 7,479,205 B2 * | 1/2009 | Okuda ...................... B08B 1/04 |
| | | 134/113 |
| 2013/0306101 A1 * | 11/2013 | Swanson ............... B08B 7/0021 |
| | | 134/1.1 |
| 2017/0301573 A1 * | 10/2017 | Shibuya .................. B24B 37/04 |

FOREIGN PATENT DOCUMENTS

JP 2012-164559 8/2012
JP 2014079743 5/2014
(Continued)

OTHER PUBLICATIONS

Machine Generated English Translation of JP2014079743 of claims. May 8, 2014. (Year: 2014).*
(Continued)

*Primary Examiner* — Sylvia MacArthur
(74) *Attorney, Agent, or Firm* — Stephen J. Weyer, Esq.; Stites & Harbison, PLLC

(57) ABSTRACT

A nozzle according to the invention includes a liquid flow passage through which a liquid flows, a gas flow passage through which a gas flows, the gas flow passage communicating with the liquid flow passage and feeding the gas to the liquid flow passage, and a plasma generating mechanism for generating plasma in the gas fed from the gas flow passage to the liquid flow passage, in which the plasma generating mechanism includes a first electrode provided so as to be exposed to an inside of the liquid flow passage, a second electrode provided so as not to be exposed to the inside of the liquid flow passage and so as to be exposed to an inside of the gas flow passage, and a power source for applying a predetermined voltage across the first electrode and the second electrode, and in which the liquid with which the gas including the generated plasma is mixed as bubbles having a predetermined diameter is spouted.

14 Claims, 3 Drawing Sheets

(51) Int. Cl.
*B24B 37/04* (2012.01)
*H01J 37/32* (2006.01)

(52) U.S. Cl.
CPC .... *H01J 37/3255* (2013.01); *H01J 37/32568* (2013.01); *H01L 21/6708* (2013.01); *H01J 2237/334* (2013.01)

(56) References Cited

FOREIGN PATENT DOCUMENTS

| | | |
|---|---|---|
| JP | 2015186838 | 10/2015 |
| JP | 2016-037442 | 3/2016 |
| WO | WO-2012/157034 | 11/2012 |

OTHER PUBLICATIONS

Machine Generated English Translation of JP2014079743 of specification. May 8, 2014. (Year: 2014).*
Office Action dated Mar. 3, 2020 in corresponding Japanese Application No. 2016-083322.

\* cited by examiner

NOZZLE AND WORK POLISHING APPARATUS

CROSS-REFERENCE TO RELATED APPLICATION

This application is based upon and claims the benefit of priority of the prior Japanese Patent Application No. 2016-083322, filed on Apr. 19, 2016, and the entire contents of which are incorporated herein by reference.

Technical Field

The present invention relates to a nozzle and a work polishing apparatus and, more particularly, to a nozzle for discharging a liquid with which a gas including generated plasma is mixed as bubbles having a predetermined diameter and a work polishing apparatus provided with the nozzle. In this application, polishing is used as a broad sense including grinding.

Background Art

Although a substrate (work) needs to be flattened in manufacturing semiconductor power devices, it is difficult to efficiently flatten the substrate using conventional mechanical machining because a wide band gap semiconductor substrate typified by silicon carbide (SiC), gallium nitride (GaN), or diamond is hard and brittle.

As a result of diligent study by the inventors of this application and the like, it was found that, by polishing a work using a polishing liquid with which a gas including generated plasma is mixed as fine bubbles, the work can be efficiently polished due to added chemical polishing action and a hard material such as SiC, GaN, or diamond can also be polished (see PTL 1: JP-A-2015-186838).

Conventionally, a structure is assumed in which a gas activated by generated plasma is produced in advance and the gas is mixed with a polishing liquid. However, since an activation loss of the activated gas advances in this structure, the amount (that is, the utilization efficiency) of the gas that can be used in the activated state reduces and desired polishing effects cannot be obtained.

SUMMARY OF INVENTION

Technical Problem

The inventors and the like have technically thought that the above problem can be solved by using the structure in which discharge is caused when a gas is included in a polishing liquid instead of the above structure. The nozzle and the like described in PTL 2: JP-A-2014-079743 can be considered as an example of this structure.

That is, if the nozzle illustrated in PTL 2 above is used, discharge can be caused in a polishing liquid including a gas instead of the structure in which an activated gas is produced in advance and the gas is mixed with a polishing liquid. Accordingly, the amount of an activation loss of an activated gas can be reduced, the effect of increasing the utilization efficiency is expected.

However, since discharge is caused in a polishing liquid including a gas and a pair of electrodes provided for energization needs to be dipped in the liquid, electric current directly flows through the liquid and a power loss increases, thereby causing a conflicting subject such as degradation of the utilization efficiency of electric power.

Solution to Problem

The invention addresses the above problem with an object of providing a nozzle capable of solving conflicting subjects: reduction of the amount of an activation loss in an activated gas included in a liquid and reduction of a power loss during production of an activated gas.

The invention solves the above subjects using solutions as described below.

A nozzle according to the invention includes a liquid flow passage through which a liquid flows, a gas flow passage through which a gas flows, the gas flow passage communicating with the liquid flow passage and feeding the gas to the liquid flow passage, and a plasma generating mechanism for generating plasma in the gas fed from the gas flow passage to the liquid flow passage, in which the plasma generating mechanism includes a first electrode provided so as to be exposed to an inside of the liquid flow passage, a second electrode so as not to be exposed to the inside of the liquid flow passage and so as to be exposed to an inside of the gas flow passage, and a power source for applying a predetermined voltage across the first electrode and the second electrode, and in which the liquid with which the gas including the generated plasma is mixed as bubbles having a predetermined diameter is discharged.

Advantageous Effects of Invention

In the nozzle according to the invention, it is possible to achieve a nozzle capable of performing discharge for generating plasma in a gas fed into a liquid without dipping one of a pair of electrodes in the liquid. This can solve conflicting subjects: reduction of the amount of an activation loss of an activated gas included in the liquid and reduction of a power loss during production of the activated gas.

In addition, since the work polishing apparatus having the nozzle according to the invention can use a polishing liquid including an activated gas having a less activation loss, the work polishing apparatus can efficiently polish a work made of a hard material such as particularly SiC, GaN, or diamond.

Figure 1:
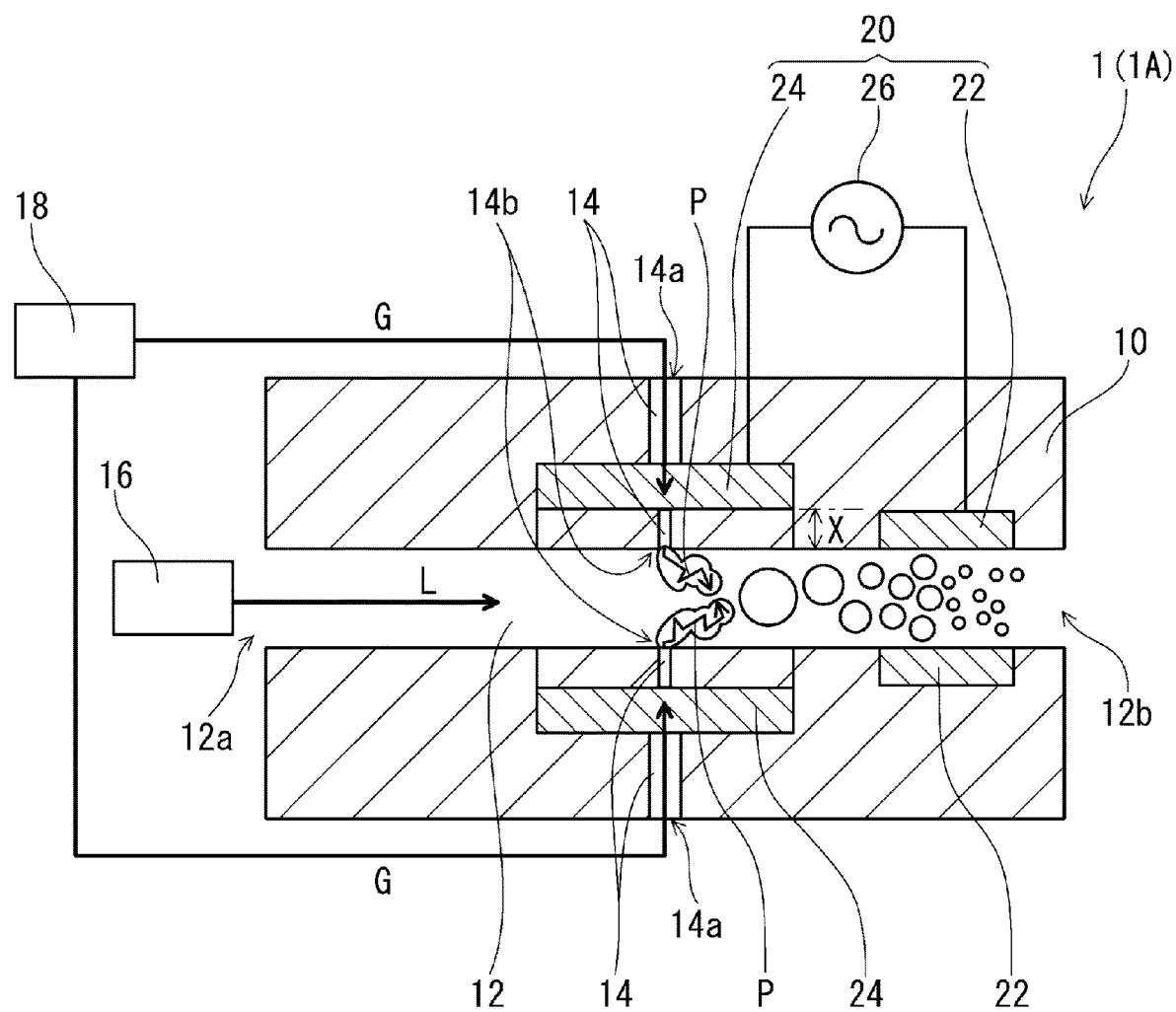
FIG. 1 is a schematic view illustrating an example of a nozzle according to a first embodiment of the invention.

DESCRIPTION OF EMBODIMENTS (Nozzle According to the First Embodiment)

A nozzle 1 according to the embodiment of the invention will be described in detail below with reference to the drawings. In all drawings used to describe the embodiment, components having the same function may be given the same reference numeral to omit repeated descriptions.

The nozzle 1 spouts a liquid with which a gas including generated plasma is mixed as bubbles having a predetermined diameter. If the diameter of bubbles is set to, for example, approximately 10 nm to 1000 μm (referred to as micro/nano bubbles), a liquid with which a gas activated by the generated plasma is mixed as such bubbles (referred to as plasma micro/nano bubbles) is obtained. Accordingly, when a polishing liquid as the liquid and the nozzle 1 is applied to the work polishing apparatus as in an example, which will be described later, it is possible to obtain very useful working effects such as improvement of the polishing rate.

A cross sectional view (schematic view) of the nozzle 1 (1A) according to the first embodiment is illustrated in FIG. 1. The nozzle 1 (1A) is provided with a liquid flow passage 12 through which a liquid passes in a main unit 10. In addition, the nozzle 1 (1A) is provided with a gas flow passage 14 through which a gas flows and that communicates with the liquid flow passage 12 so as to feed the gas from a delivery port 14b to the liquid flow passage 12. The inner diameters of the liquid flow passage 12 and the gas flow passage 14 are set as appropriate according to the application purpose or the like.

As an example of the liquid described above, water, another drug solution, a treatment liquid or the like (such as a polishing liquid or the like used for the polishing apparatus described above) is assumed. On the other hand, as an example of the gas described above, air, oxygen, an inert gas, a fluorine-based gas, or the like is assumed.

First, the structure of the liquid flow passage 12 and the structure of the gas flow passage 14 will be described. The liquid flow passage 12 and the gas flow passage 14 are made of an insulating material (for example, a ceramic material).

The liquid flow passage 12 has an inflow port 12a and a outflow port 12b. The inflow port 12a receives a liquid supplied from a liquid storage unit 16 via a liquid feed portion (not illustrated) such as a pump, a pipe (not illustrated), and the like. The outflow port 12b spouts a liquid of a liquid-gas two-phase flow including the gas fed to an intermediate portion of the passage. The flow direction of the liquid is indicated by arrow L in FIG. 1. The liquid spouted from the outflow port 12b is supplied via a pipe or the like (not illustrated) and used for a predetermined purpose. The liquid having been used may be discarded as is or may be collected and circulated (not illustrated) through the liquid storage unit 16.

In addition, on the inside (inner wall) of the liquid flow passage 12, a spiral (or substantially spiral) projection (not illustrated) or the like may be provided in the longitudinal direction (flow direction) as a spiral flow generation mechanism. In this structure, the liquid having flowed through the projection becomes a spiral flow to generate bubbles (that is, micro/nano bubbles) having a predetermined diameter (from 10 nm to 1000 μm) at a high rate.

On the other hand, the gas flow passage 14 has a supply port 14a and the delivery port 14b. The supply port 14a receives gas from a gas storage unit 18 via a pipe or the like (not illustrated). The delivery port 14b feeds the gas to an intermediate portion of the liquid flow passage 12. The flow direction of the gas is indicated by arrow G in FIG. 1. More specifically, the delivery port 14b is a connection portion in which the gas flow passage 14 is connected to the liquid flow passage 12 and is an opening formed in an inner wall of the liquid flow passage 12.

The feeding mechanism for feeding (flowing) the gas is considered to use a feeding force using the pressure (inner pressure) of the gas storage unit in the case in which the gas storage unit 18 is a high-pressure tank, a feeding force by a cylinder or pump, a feeding force by the Venturi effect caused when a liquid flows through the liquid flow passage 12 toward which the delivery port 14b is opened, or the like (none of the components are not illustrated).

In the above structure, the liquid with which the gas is mixed as bubbles (that is, the liquid (of a liquid-gas two-phase flow) including micro/nano bubbles having a diameter of 10 nm to 1000 μm) having a predetermined diameter can be spouted from the outflow port 12b.

Next, the embodiment has, as a characteristic feature, a plasma generating mechanism 20 for generating plasma in the gas to be fed into the liquid in the liquid flow passage 12 from the delivery port 14b of the gas flow passage 14. More specifically, the plasma generating mechanism 20 generates plasma (illustrated by arrow P) in the gas (that is, the gas being fed into the liquid in the liquid flow passage 12 from the delivery port 14b, as illustrated in FIG. 1) at the position of feeding from the delivery port 14b. At this time, the pressure state is kept so as to prevent the liquid in the liquid flow passage 12 from entering the inside (the upstream side in the gas flow direction) of the gas flow passage 14 from the delivery port 14b.

An example of the structure of the plasma generating mechanism 20 will be described. The plasma generating mechanism 20 according to the embodiment has the first electrode 22, exposed to the inside of the liquid flow passage 12, that makes direct contact with the liquid flowing through the liquid flow passage 12. In addition, as the electrode to be paired with the first electrode 22, the plasma generating mechanism 20 has a second electrode 24, unexposed to the inside of the liquid flow passage 12 so as not to contact with the liquid flowing through the liquid flow passage 12 and exposed to the inside of the gas flow passage 14, that makes direct contact with the gas flowing through the gas flow passage 14. In addition, the plasma generating mechanism 20 has a power source 26 that applies a predetermined voltage across the first electrode 22 and the second electrode 24. The peripheries of first electrode 22 and the second electrode 24 are covered with an insulating material (for example, a ceramic material).

In the structure described above, by applying a predetermined voltage (for example, a high voltage of approximately 1 kV to 20 kV) across the first electrode 22 and the second electrode 24 using the power source 26, plasma can be generated in the gas being fed into the liquid in the liquid flow passage 12 from the delivery port 14b. That is, plasma micro/nano bubbles can be generated. This enables the generation of various types of radical species such as OH radicals according to the type of the gas, so chemical activation is promoted, thereby causing oxidizing, etching, and the like.

The first electrode 22 is preferably disposed in a position downstream in the liquid flow direction (direction indicated by arrow L) of the delivery port 14b in the liquid flow passage 12.

Although the gas being fed into the liquid in the liquid flow passage 12 from the delivery port 14b extends in the flow direction of the liquid, since the above structure can cause a difference in the electric potential in the extension direction, plasma can be generated across the entire area within the gas.

In addition, the second electrode 24 is preferably provided distantly from the delivery port 14b (that is, the portion in which the gas flow passage 14 is connected to the liquid flow passage 12) toward the inside (the upstream side in the flow direction (the direction indicated by arrow G) of the liquid)

of the gas flow passage 14 by a predetermined length X (for example, X is approximately 1 mm to 3 mm). The value of X above is an example and only needs to be set to a value so as to keep the state in which the second electrode 24 does not make contact with the liquid flowing through the liquid flow passage 12 in consideration of various conditions such as the inner diameter of the gas flow passage 14, the inner diameter of the liquid flow passage 12, and the pressure of a gas flowing through the gas flow passage 14.

This can generate plasma in the gas at the position of feeding from the delivery port 14b to the liquid in the liquid flow passage 12 by applying a voltage using the second electrode 24 and the first electrode 22 in contact with the liquid while keeping the state in which the second electrode 24 does not make contact with the liquid flowing through the liquid flow passage 12.

As described above, it is possible to achieve the structure in which a predetermined voltage is applied to the gas at the position of feeding from the delivery port 14b to the liquid in the liquid flow passage 12 without dipping, in the liquid, one (the second electrode 24) of the pair of electrodes (the first electrode 22 and the second electrode 24) provided for energization. Accordingly, it is possible to solve the problem that occurs in the conventional apparatus, in which both of a pair of electrodes are dipped in the liquid, the electric current directly flows through the liquid, a power loss becomes large, and the utilization efficiency of electric power degrades.

The second electrode 24 is preferably made of a porous conductive material. For example, a porous material made of stainless alloy or the like is adopted. Since this can increase the area of contact between the second electrode 24 and the gas flowing through the gas flow passage 14 and making contact with the second electrode 24, the efficiency of generation of plasma in the gas can be improved (the amount of plasma generated can be increased).

(Nozzle According to the Second Embodiment)

Next, the nozzle 1 (1B) according to the second embodiment of the invention will be described. The basic structure of the nozzle 1 (1B) according to the embodiment is the same as that of the nozzle 1 (1A) according to the first embodiment described above. However, the nozzle 1 (1B) has differences particularly in the structures of the liquid flow passage 12 and the gas flow passage 14. The embodiment will be described below centering on the differences.

Figure 2:
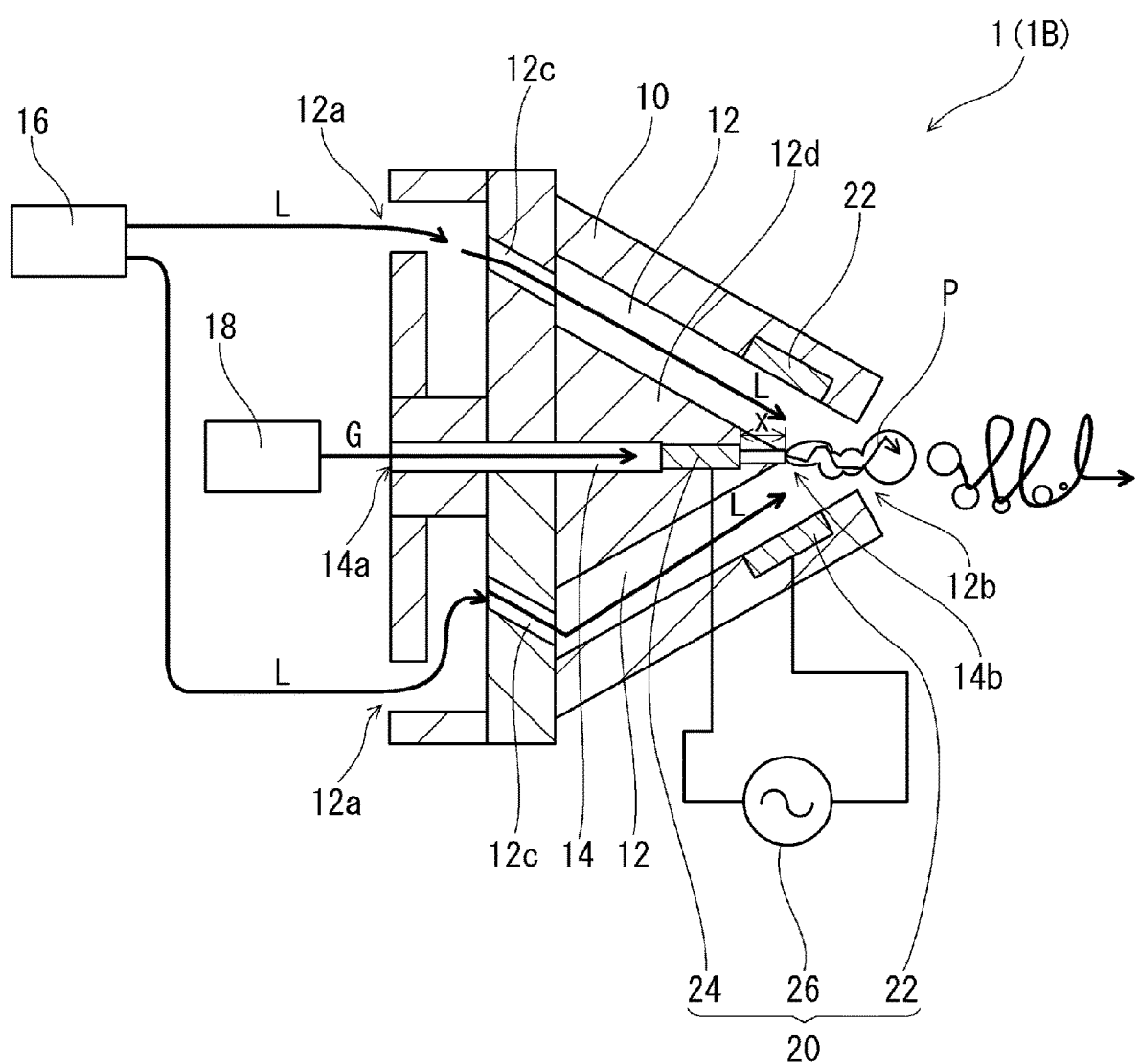
FIG. 2 is a schematic view illustrating an example of a nozzle according to a second embodiment of the invention.

A cross sectional view (schematic view) of the nozzle 1 (1B) according to the second embodiment is illustrated in FIG. 2. In the nozzle 1 (1B), the liquid flow passage 12 is configured to have a conical space. For example, the tip of the cone has an angle of approximately 20 to 45 degrees with respect to the central axis.

As a spiral flow generation mechanism in the liquid flow passage 12, an intermediate flow passage 12c is preferably provided such that the intermediate flow passage 12c offsets by a predetermined angle with respect to the central axis. This causes the liquid flowing through the liquid flow passage 12 to be formed in a spiral flow, thereby enabling the generation of bubbles (that is, micro/nano bubbles) having a predetermined diameter (approximately 10 nm to 1000 μm) at a high rate. Although the predetermined angle is set to, for example, approximately 20 to 60 degrees, the invention is not limited to this example.

On the other hand, the gas flow passage 14 is formed so as to penetrate through a conical core material portion 12d constituting the inner wall of the conical liquid flow passage 12. In addition, the delivery port 14b through which the gas is fed from the gas flow passage 14 to the liquid flow passage 12 is provided at the tip of the core material portion 12d. Since this forces the gas to be present at the center of a spiral flow immediately after the gas is fed into the liquid, micro/nano bubbles can be generated efficiently and stably.

The liquid flow passage 12 is formed so as to have an inner diameter reduced from the position of the delivery port 14b for the gas toward the outflow port 12b. This causes the spiral flow of a liquid-gas two-phase flow generated in the liquid flow passage 12 to have a larger spiral speed toward the outflow port 12b, thereby obtaining the effect of generating finer micro/nano bubbles.

(Work Polishing Apparatus)

Figure 3:
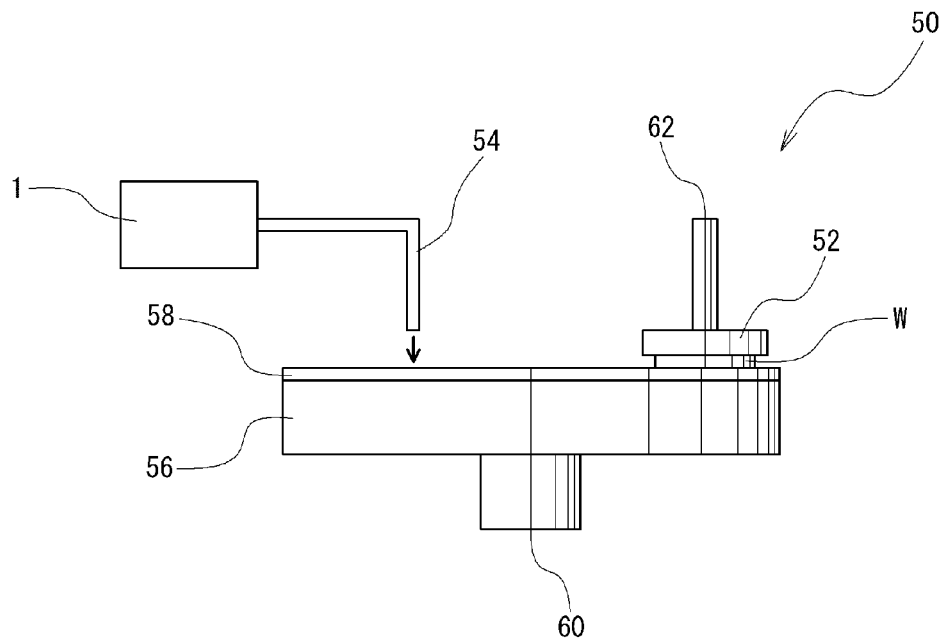
FIG. 3 is a schematic view illustrating an example of a work polishing apparatus according the embodiment of the invention.

Next, a work polishing apparatus 50 according to the embodiment of the invention will be described. This work polishing apparatus 50 particularly has the nozzle 1 and uses a polishing liquid with which plasma micro/nano bubbles are mixed. FIG. 3 is a schematic view illustrating the work polishing apparatus 50.

This work polishing apparatus 50 polishes the surface of a work W held by a polishing head 52 by pushing the work W against a polishing portion 58 of the surface of a rotating surface plate 56 while supplying the polishing liquid. A specific example of the structure will be described below.

First, the surface plate 56 is rotated around a shaft 60 by a rotary mechanism (not illustrated) on a horizontal plane. The surface of the surface plate 56 is formed as the polishing portion 58. A polishing cloth made from fabric such as, for example, nonwoven fabric or a polyurethane resin sheet is adhered to the polishing portion 58. Alternatively, the polishing portion 58 may also be configured by, for example, embedding special particles in the surface of the surface plate 56.

In addition, the polishing head 52 retains the work W on its lower surface using double-sided tape or suction. Known polishing heads having various structures can be used as the polishing head 52. The polishing head 52 can move upward and downward and rotates on a horizontal plane about a shaft 62.

Depending on the material or the like of the work W, various types of known polishing liquids can be used as the polishing liquid to be supplied onto the surface plate 56 via the supply unit 54. The supply unit 54 may have a pump, a regulator, a switching valve, and the like which are not illustrated.

As a mechanism for supplying a polishing liquid, the structure that directly uses a polishing liquid as the liquid supplied to the nozzle 1 and spouted from the outflow port 12b is considered. In this structure, a polishing liquid with which bubbles (plasma micro/nano bubbles) including generated plasma having a predetermined diameter are mixed can be supplied onto the surface plate 56 via the supply unit 54. In this case, air, oxygen, an inert gas, a fluorine-based gas, or a mixture of these gases is preferably used as the gas.

In this structure, since abrasive grains mixed with the polishing liquid are further dispersed uniformly in the polishing liquid by the effects of micro/nano bubbles, the work W can be polished uniformly.

In addition, since the polishing liquid includes a gas activated by generated plasma as fine bubbles (plasma micro/nano bubbles) having a predetermined diameter, the plasma micro/nano bubbles directly act on the surface of the work W and oxidize and etch the surface of the work W The oxidization and etching deteriorate the surface of the work W and it is possible to obtain the working effect of removing the deteriorated layer by mechanical polishing using the polishing liquid including abrasive grains.

In addition, plasma micro/nano bubbles are apt to collect more OH⁻ groups when charged. If bubbles disappear in the state in which there are many OH⁻ groups, strong effects can be obtained because the activity of OH radicals causes oxidizing and etching.

That is, in the embodiment, the work W can be efficiently polished by the interaction between mechanical polishing (mechanical polishing made uniform by micro/nano bubbles) by abrasive grains and chemical polishing (chemical polishing made uniform by micro/nano bubbles) by a gas (plasma micro/nano bubbles) activated by generated plasma and oxidization and etching caused by activation of OH radicals when the bubbles disappear are added. In addition, since not only mechanical polishing, but also chemical polishing is caused, hard materials such as particularly SiC, GaN, and diamond can be polished.

Figure 4:
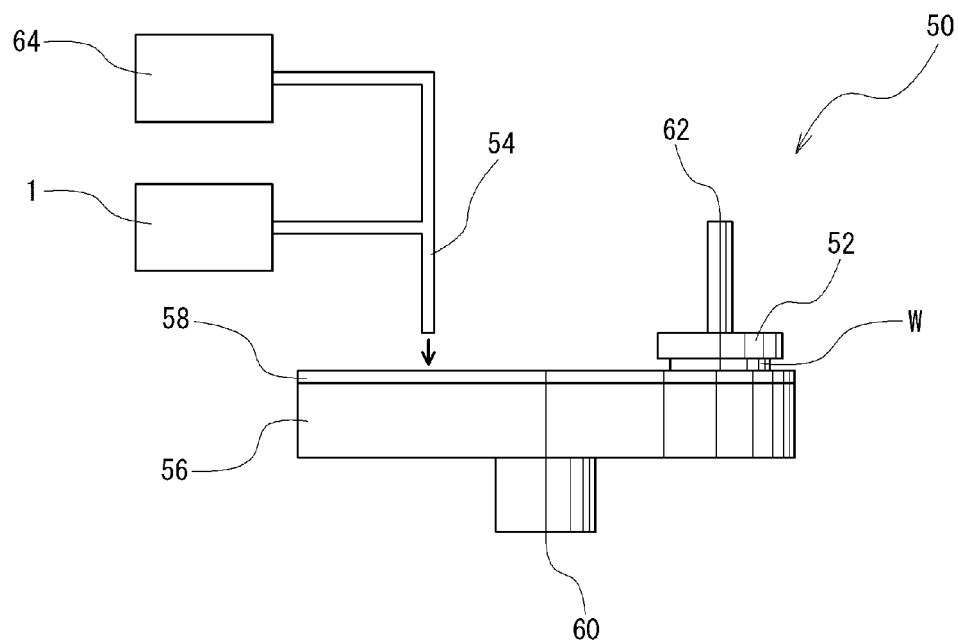
FIG. 4 is a schematic view illustrating a modification of the work polishing apparatus according the embodiment of the invention.

On the other hand, in a modification of the work polishing apparatus 50, use of water (including water containing a predetermined addition agent, water for which pH has been adjusted, and the like) as the liquid supplied to the nozzle 1 and spouted from the outflow port 12b is considered. In this structure, water with which bubbles (plasma micro/nano bubbles) including generated plasma having a predetermined diameter are mixed can be supplied onto the surface plate 56 after being mixed with the polishing liquid in the supply unit 54 (see FIG. 4). Reference numeral 64 in the drawing represents a polishing liquid supply mechanism for supplying the polishing liquid. This modification also provides the working effect as in the structure described above.

Studies by inventors of this application and the like have shown that the polishing rate becomes approximately double or more in the case of mixture of 50% of water (plasma micro/nano bubble water) including plasma micro/nano bubbles and 50% of the polishing liquid (slurry), as compared with the case of mixture of 50% of simple micro/nano bubble water and 50% of slurry. Even in the case of mixture of 50% of simple micro/nano bubble water and 50% of slurry, the polishing rate becomes higher than the case in which 100% of slurry is used.

As described above, in the nozzle according to the invention, it is possible to perform discharge for generating plasma in a gas fed into a liquid without dipping one of a pair of electrodes for applying a voltage to the gas in the liquid. Since this can reduce the amount of an activation loss of an activated gas contained in the liquid and the power loss when the activated gas is generated, conflicting subjects can be solved. As described above, plasma micro/nano bubbles can be generated very efficiently.

In addition, since the work polishing apparatus having the nozzle according to the invention can use a polishing liquid including an activated gas having a less activation loss, the work polishing apparatus can efficiently polish a work made of a hard material such as particularly SiC, GaN, or diamond.

In addition, since the work polishing apparatus having the nozzle according to the invention can reduce the time from when plasma micro/nano bubbles are generated until a polishing liquid including plasma micro/nano bubbles reaches the work, the working effect of the polishing liquid can be stabilized, thereby having advantage in the reproducibility of polishing.

That is, the invention is effective for the reproducibility of polishing and thereby appropriate for the improvement of the accuracy of polishing of hard materials.

The invention is not limited to the above embodiments and various modifications may be made without departing from the scope of the invention. In particular, a work polishing apparatus is adopted as an example, but the invention is not limited the example and it will be appreciated that the invention is applicable to various types of work machining apparatuses.

What is claimed is:

1. A nozzle comprising:
a liquid flow passage through which a liquid flows;
a gas flow passage through which a gas flows, the gas flow passage communicating with the liquid flow passage and feed the gas to the liquid flow passage; and
a plasma generating mechanism for generating plasma in the gas fed from the gas flow passage to the liquid flow passage,
wherein the plasma generating mechanism includes a first electrode provided so as to be exposed to an inside of the liquid flow passage,
a second electrode provided so as not to be exposed to the inside of the liquid flow passage and so as to be exposed to an inside of the gas flow passage, and
a power source for applying a predetermined voltage across the first electrode and the second electrode,
wherein the liquid with which the gas including the generated plasma is mixed as bubbles having a predetermined diameter is spouted, and
wherein the second electrode is provided distantly from a delivery port toward an inside of the gas flow passage, the delivery port being provided at a portion in which the gas flow passage is connected to the liquid flow passage.

2. The nozzle according to claim 1,
wherein the bubbles have a diameter of 10 nm to 1000 μm.

3. The nozzle according to claim 2,
wherein the second electrode provided distantly from a delivery port by 1 mm to 3 mm toward an inside of the gas flow passage.

4. The nozzle according to claim 3,
wherein the first electrode is provided downstream of the delivery port in the liquid flow passage.

5. The nozzle according to claim 4,
wherein the second electrode is made of a porous conductive material.

6. The nozzle according to claim 3,
wherein the second electrode is made of a porous conductive material.

7. The nozzle according to claim 2,
wherein the second electrode is made of a porous conductive material.

8. The nozzle according to claim 1,
wherein the second electrode provided distantly from a delivery port by 1 mm to 3 mm toward an inside of the gas flow passage.

9. The nozzle according to claim 1,
wherein the first electrode is provided downstream of the delivery port in the liquid flow passage.

10. The nozzle according to claim 9,
wherein the second electrode is made of a porous conductive material.

11. The nozzle according to claim 1,
wherein the second electrode is made of a porous conductive material.

12. The nozzle according to claim 1,
wherein the second electrode is made of a porous conductive material.

13. A work polishing apparatus comprising:
a nozzle comprising:
a liquid flow passage through which a liquid flows;

a gas flow passage through which a gas flows, the gas flow passage communicating with the liquid flow passage and feed the gas to the liquid flow passage; and a plasma generating mechanism for generating plasma in the gas fed from the gas flow passage to the liquid flow passage, wherein the plasma generating mechanism includes a first electrode provided so as to be exposed to an inside of the liquid flow passage, a second electrode provided so as not to be exposed to the inside of the liquid flow passage and so as to be exposed to an inside of the gas flow passage, wherein the second electrode is provided distantly from a delivery port toward an inside of the gas flow passage and the delivery port is provided at a portion in which the gas flow passage is connected to the liquid flow passage, and a power source for applying a predetermined voltage across the first electrode and the second electrode, and wherein the liquid with which the gas including the generated plasma is mixed as bubbles having a predetermined diameter is spouted;

a surface plate for polishing a work; and a supply unit for supplying, to the surface plate, the liquid with which the gas including the generated plasma is mixed as bubbles having a predetermined diameter.

14. The work polishing apparatus according to claim 13, wherein air, oxygen, an inert gas, or a fluorine-based gas is used as the gas.

* * * * *